(12) United States Patent
Kim et al.

(10) Patent No.: US 7,679,105 B2
(45) Date of Patent: Mar. 16, 2010

(54) HETERO JUNCTION BIPOLAR TRANSISTOR AND METHOD OF MANUFACTURING THE SAME

(75) Inventors: Yong Won Kim, Daejeon (KR); Eun Soo Nam, Daejeon (KR); Ho Young Kim, Daejeon (KR); Sang Seok Lee, Daejeon (KR); Dong Suk Jun, Daejeon (KR); Hong Yeol Lee, Choongcheongbuk-do (KR); Seon Eui Hong, Daejeon (KR); Dong Young Kim, Daejeon (KR); Jong Won Lim, Daejeon (KR); Myoung Sook Oh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 404 days.

(21) Appl. No.: 11/634,614

(22) Filed: Dec. 6, 2006

(65) Prior Publication Data
US 2007/0131971 A1    Jun. 14, 2007

(30) Foreign Application Priority Data
Dec. 8, 2005    (KR) ...................... 10-2005-0120171

(51) Int. Cl.
*H01L 29/24* (2006.01)
(52) U.S. Cl. ................. 257/197; 257/198; 257/E29.188
(58) Field of Classification Search ................. 257/197, 257/198, 201, E29.185, E29.188
See application file for complete search history.

(56) References Cited
U.S. PATENT DOCUMENTS
5,345,097 A    9/1994    Nakagawa
(Continued)

FOREIGN PATENT DOCUMENTS
KR    P19990669114    9/1999
(Continued)

OTHER PUBLICATIONS
European Search Report—dated Nov. 18, 2008; Application No./Patent No. 06125528.7—2203 / 1796173.
(Continued)

*Primary Examiner*—Minh-Loan T Tran
(74) *Attorney, Agent, or Firm*—Ladas & Parry LLP (57) ABSTRACT

Provided are a hetero-junction bipolar transistor (HBT) that can increase data processing speed and a method of manufacturing the hetero-junction bipolar transistor. The HBT includes a semi-insulating compound substrate, a sub-collector layer formed on the semi-insulating compound substrate, a pair of collector electrodes disposed at a predetermined distance apart from each other on a predetermined portion of the sub-collector layer, a collector layer and a base layer disposed between the collector electrodes, a pair of base electrodes disposed at a predetermined distance apart from each other on a predetermined portion of the base layer, an emitter layer stack disposed between the base electrodes, and an emitter electrode that is formed on the emitter layer stack, and includes a portion having a line width wider than the line width of the emitter layer stack, wherein both sidewalls of the emitter electrode are respectively aligned with inner walls of the pair of base electrodes, and sidewalls of the collector layer and the base layer are located between outer sidewalls of the pair of base electrodes of the pair of base electrodes.

9 Claims, 7 Drawing Sheets

U.S. PATENT DOCUMENTS

| | | |
|---|---|---|
| 5,569,944 A | 10/1996 | Delaney et al. |
| 5,789,301 A | 8/1998 | Hill |
| 2004/0224460 A1 | 11/2004 | McHugo et al. |

FOREIGN PATENT DOCUMENTS

| | | |
|---|---|---|
| KR | 10-2004-0057000 | 7/2004 |
| WO | 03/063228 A1 | 7/2003 |
| WO | 2004/061970 A1 | 7/2004 |

OTHER PUBLICATIONS

Hsin, Y.M., et al., "Experimental I-V characteristics of AlGaAs/GaAs and GaInP/GaAs (D) HBTs with thin bases." 2000. *Solid-State Electronics*, vol. 44, pp. 587-592.

Yanagisawa, M., et al., "A Robust All-Wet-Etching Process for Mesa Formation of InGaAs-InP HBT Featuring High Uniformity and High Reproducibility." Aug. 2004. *IEEE Transactions on Electron Devices*, vol. 51, No. 8, pp. 1234-1240.

HETERO JUNCTION BIPOLAR TRANSISTOR AND METHOD OF MANUFACTURING THE SAME

CROSS-REFERENCE TO RELATED PATENT APPLICATION

This application claims the benefit of Korean Patent Application No. 10-2005-0120171, filed on Dec. 8, 2005, in the Korean Intellectual Property Office, the disclosure of which is incorporated herein in its entirety by reference.

BACKGROUND OF THE INVENTION

1. Field of the Invention

The present invention relates to a hetero-junction bipolar transistor and a method of manufacturing the same, and more particularly, to a hetero-junction bipolar transistor that can increase data processing speed by reducing base resistance and parasitic capacitance and a method of manufacturing the same.

2. Description of the Related Art

A hetero-junction bipolar transistor (HBT) is a core device in microwave or millimeter wave band technologies that requires high speed characteristics. The HBT consists of a three-phase electrode composed of an emitter, a base, and a collector. In particular, the emitter of the HBT is formed of a semiconductor material having a higher energy bandwidth than the base so that a high current gain and a high cut-off frequency can be obtained.

Here, the cut-off frequency is related to the resistance of the base. That is, to increase the cut-off frequency, a thickness and/or concentration of a base material can be changed or a base electrode can be located as close as possible to the emitter electrode. Currently, the HBTs are formed using a method in which the base electrode and the emitter electrode are closely disposed to each other in a self aligning manner in a state where the thickness and the concentration of the base material are optimized. This method is shown in FIGS. 1 and 2.

Figure 1:
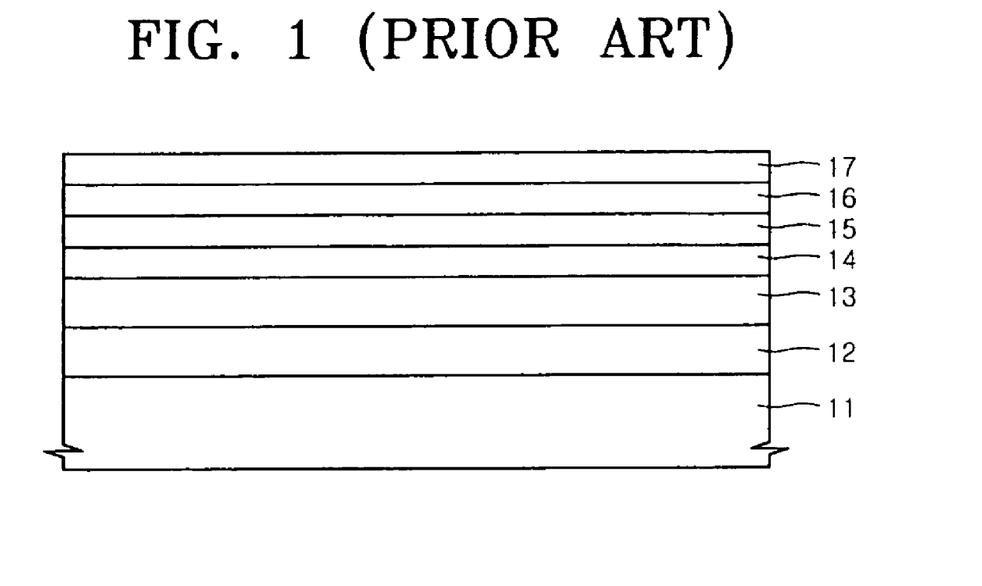
FIGS. 1 and 2 are cross-sectional views illustrating a method of manufacturing a conventional hetero-junction bipolar transistor.

Referring to FIG. 1, an n+ InGaAs sub-collector layer 12, an n− InGaAs collector layer 13, a p+ InGaAs base layer 14, an n InP emitter layer 15, an n+ InP emitter grade layer 16, and an n+ InGaAs emitter cap layer 17 are sequentially formed on a semi-insulated InP substrate 11.

Figure 2:
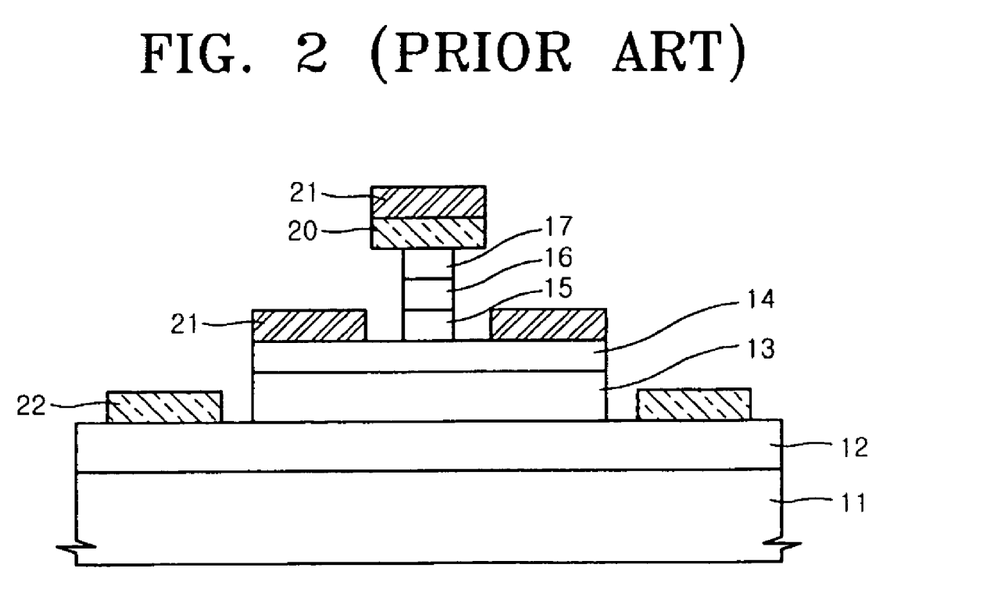

Referring to FIG. 2, after a patterned emitter electrode 20 is formed on the n+ InGaAs emitter cap layer 17, the n+ InGaAs emitter cap layer 17, the n+ InP emitter grade layer 16, and the n InP emitter layer 15 are etched using the emitter electrode 20 as a mask. Then, the n+ InGaAs emitter cap layer 17, the n+ InP emitter grade layer 16, and the n InP emitter layer 15 are over-etched using a wet etching method. As a result, the n+ InGaAs emitter cap layer 17, the n+ InP emitter grade layer 16, the n InP emitter layer 15, and the emitter electrode 20 have an under-cut structure.

Afterward, a base electrode 21 is selectively formed on the exposed p+ InGaAs base layer 14. The base electrode 21 is formed in a self-aligning manner by the under-cut structure of the emitter electrode 20 and the emitter material layers 17, 16, and 15. Next, a photoresist pattern (not shown) covering predetermined portions of the emitter electrode 20 and the base electrode 21 is formed. An HBT region is defined and the n+ InGaAs sub-collector layer 12 is exposed by etching the base electrode 21, the p+ InGaAs base layer 14, and the n− InGaAs collector layer 13 using the photoresist pattern. At this time the n− InGaAs collector layer 13 has a thickness usually greater than the p+ InGaAs base layer 14. To etch the n− InGaAs collector layer 13 which is relatively thick, a directional etching and/or isotropic wet etching can be performed. Then a collector electrode 12 (not shown) is formed in a predetermined portion of the n+ InGaAs sub-collector layer 12.

However, when the emitter material layer is over-etched to form the base electrode 21 in a self-aligning manner as described above, a portion of the p+ InGaAs base layer 14 may be lost. Also, when the p+ InGaAs base layer 14 and the n− InGaAs collector layer 13 are etched to define the HBT region, the p+ InGaAs base layer 14 disposed on the n− InGaAs collector layer 13 can be over-etched due to the directional etching and/or the isotropic etching of the n− InGaAs collector layer 13. When the p+ InGaAs base layer 14 is over-etched, the base electrode 21 formed on the p+ InGaAs base layer 14 may be lifted, and the resistance of the p+ InGaAs base layer 14 can be increased due to its reduced thickness.

Also, since a lower surface of the conventional base electrode 21 is formed to contact an upper surface of the p+ InGaAs base layer 14, an area for forming the base electrode 21 must be ensured on the p+ InGaAs base layer 14. At this time, since the n− InGaAs collector layer 13 formed under the p+ InGaAs base layer 14 is simultaneously defined with the p+ InGaAs base layer 14, a predetermined junction area between the n− InGaAs collector layer 13 and the p+ InGaAs base layer 14 must be ensured. Therefore, a problem of increased junction capacitance between the base and the collector occurs. Also, in the HBT of FIG. 2, side surfaces of the junction area of the n− InGaAs collector layer 13 and the p+ InGaAs base layer 14 are exposed externally, thereby increasing parasitic junction capacitance.

When the resistance of the p+ InGaAs base layer 14 is increased and the junction capacitance between the base and the collector is increased, RC delay time may be increased, thereby reducing operating speed of the HBT.

SUMMARY OF THE INVENTION

The present invention provides a hetero-junction bipolar transistor (HBT) that can increase data processing speed.

The present invention also provides an HBT that can increase data processing speed by reducing resistance and parasitic capacitance.

According to an aspect of the present invention, there is provided a hetero-junction bipolar transistor comprising: a semi-insulating compound substrate; a sub-collector layer formed on the semi-insulating compound substrate; a pair of collector electrodes disposed at a predetermined distance apart from each other on a predetermined portion of the sub-collector layer; a collector layer and a base layer disposed between the collector electrodes; a pair of base electrodes disposed at a predetermined distance apart from each other on a predetermined portion of the base layer; an emitter layer stack disposed between the base electrodes; and an emitter electrode that is formed on the emitter layer stack, wherein a portion of the line width of the emitter electrode is wider than the width of the emitter layer stack, and wherein both sidewalls of the emitter electrode are respectively aligned with inner walls of the pair of base electrodes, and sidewalls of the collector layer and the base layer are located between outer sidewalls of the pair of base electrodes.

According to another aspect of the present invention, there is provided a method of manufacturing a hetero-junction bipolar transistor, the method comprising: sequentially stacking a sub-collector layer, a first etch stopper layer, a collector layer, a base layer, a second etch stopper layer, and an emitter layer on a semi-insulating compound substrate; forming an emitter electrode that contacts a predetermined portion of a surface of the emitter layer stack; forming an under-cut region by over-etching the emitter layer stack using the emitter electrode as a mask; etching a predetermined portion of the second etch stopper layer to expose a predetermined portion of the base layer disposed on both sides of the emitter electrode; selectively forming a base electrode so that the base electrode can contact the base layer exposed on both sides based on the emitter electrode; insulating the base electrode from the patterned emitter layer stack region by forming an insulating spacer in an under-cut portion of the emitter layer stack; patterning the base layer and the collector layer using the base electrode as a mask; exposing the sub-collector layer by removing the exposed first etch stopper layer using the base electrode as a mask; and selectively forming a collector electrode on the exposed sub-collector layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals refer to like elements throughout the drawings.

Figure 3:
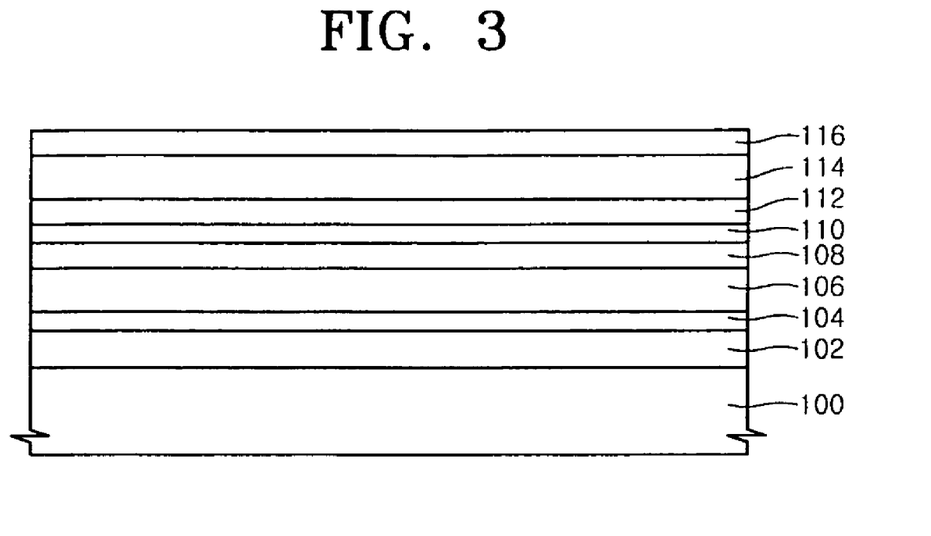
FIGS. 3 through 13 are cross-sectional views illustrating a method of manufacturing a hetero-junction bipolar transistor according to an embodiment of the present invention.

FIGS. 3 through 13 are cross-sectional views illustrating a method of manufacturing a hetero-junction bipolar transistor (HBT) according to an embodiment of the present invention Referring to FIG. 3, an n+ InGaAs sub-collector layer 102, a first etch stopper layer 104, an n− InGaAs collector layer 106, a p+ InGaAs base layer 108, a second etch stopper layer 110, an n InP emitter layer 112, an n+ InP emitter grade layer 114, and an n+ InGaAs emitter cap layer 116 are sequentially formed on a semi-insulating InP substrate 100. At this time, the first etch stopper layer 104 may be an InP layer, and the second etch stopper layer 110 may be an InGaAs layer.

Figure 4:
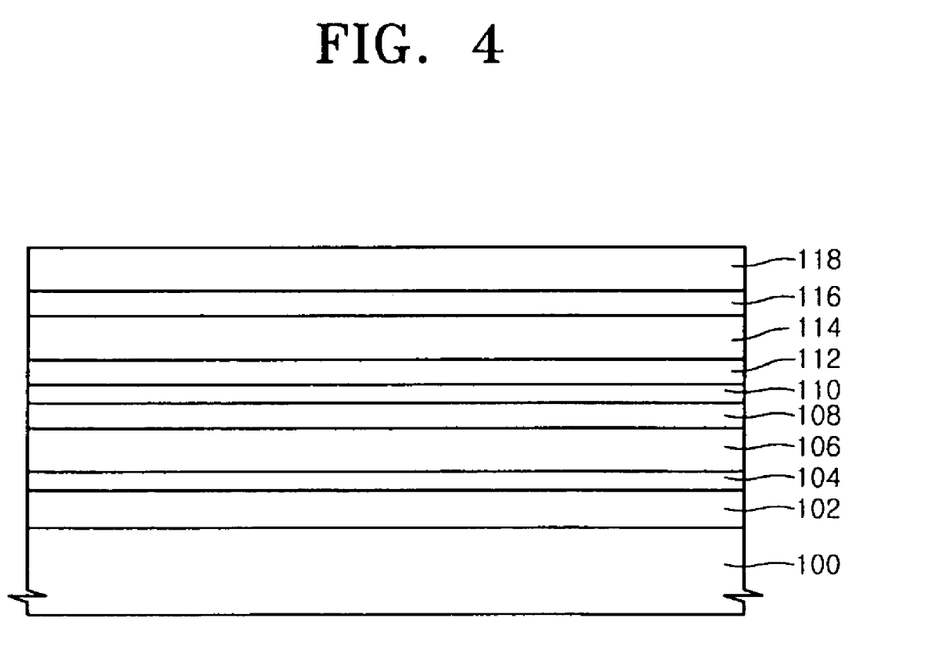

Referring to FIG. 4, an insulating film is deposited on the n+ InGaAs emitter cap layer 116 to a thickness of 500 to 1000 using, for example, a first silicon nitride film 118.

Figure 5:
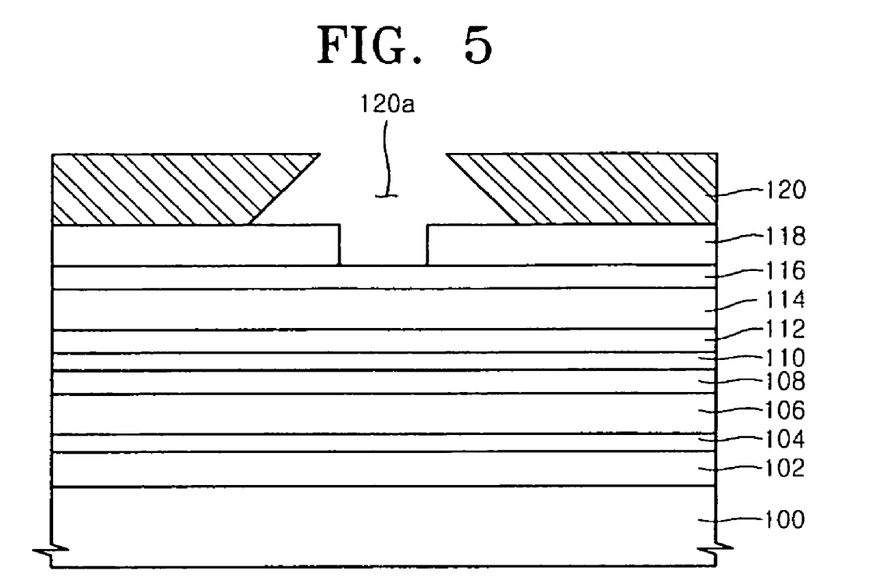

Referring to FIG. 5, a photoresist pattern 120 is formed on the first silicon nitride film 118 to define a region for forming an emitter electrode. The photoresist pattern 120 includes an aperture 120a for defining the emitter electrode. Next, after anistropically etching the first silicon nitride film 118 using the photoresist pattern 120 as a mask, the aperture 120a of the photoresist pattern 120 is expanded by developing the photoresist pattern 120. The expansion of the aperture 120a can be achieved by soaking the resultant product in a chlorobenzene solution. Also, sidewalls of the photoresist pattern 120 having the expanded aperture 120a can have an inverted mesa shape.

Figure 6:
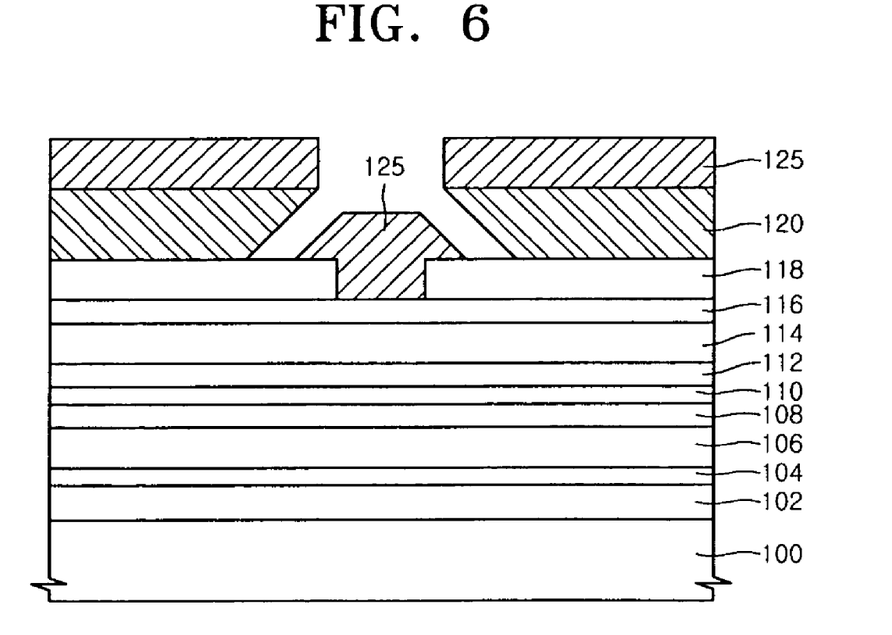

Referring to FIG. 6, an emitter electrode layer 125 is deposited on the n+ InGaAs emitter cap layer 116 exposed by the photoresist pattern 120 and the first silicon nitride film 118. The emitter electrode layer 125 can be formed using, for example, vacuum evaporation or sputtering. The emitter electrode layer 125 is formed not only on the exposed n+ InGaAs emitter cap layer 116, but also on the photoresist pattern 120.

Figure 7:
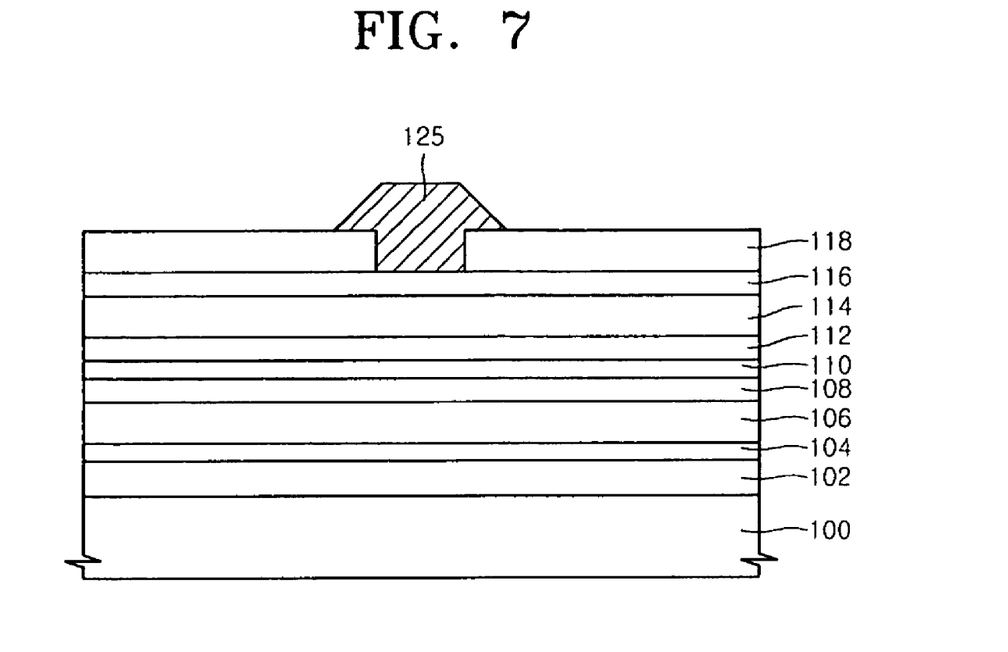

Next, referring to FIG. 7, the photoresist pattern 120 is removed using a well known method in the art. By the removal of the photoresist pattern 120, the emitter electrode layer 125 formed on the photoresist pattern 120 is lifted-off. As a result, only the emitter electrode layer 125, which is an emitter electrode 125a, contacting the n+ InGaAs emitter cap layer 116 remains on the semi-insulating InP substrate 100. The emitter electrode 125a is structured like a "T" shape having a wider upper line width than a lower line width because of the first silicon nitride film 118.

Figure 8:
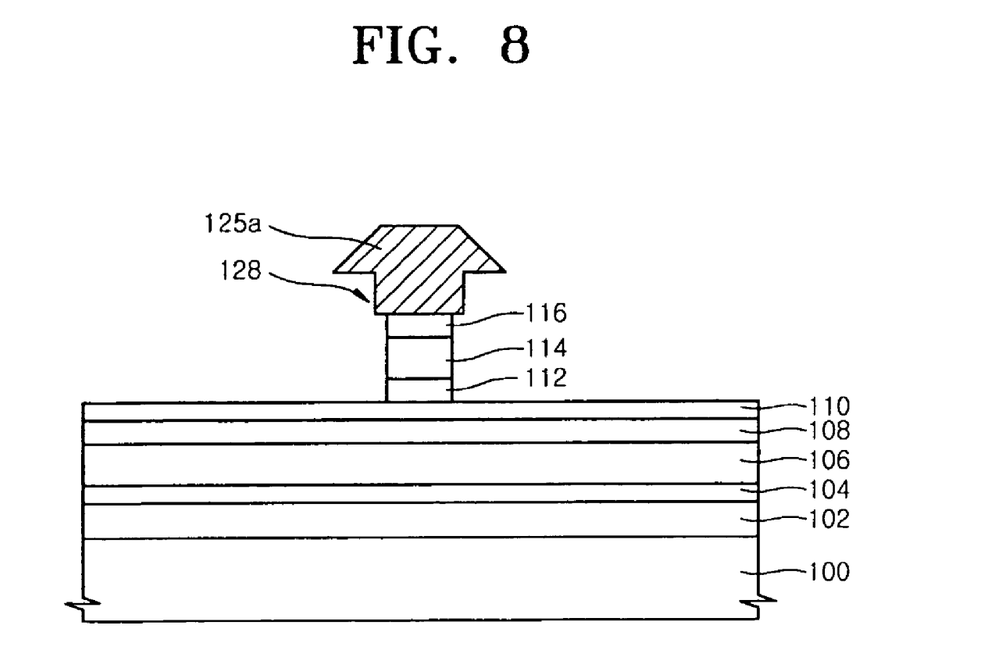

Referring to FIG. 8, the first silicon nitride film 118 remaining on both sides of the emitter electrode 125a is selectively removed using a buffered oxide etchant (BOE). The reason why the first silicon nitride film 118 is removed at this time using the BOE is to selectively remove the first silicon nitride film 118 while preventing the loss of the remaining InGaAs and InP. Then, the n+ InGaAs emitter cap layer 116, the n+ InP emitter grade layer 114, and the n InP emitter layer 112 are etched using the emitter electrode 125a as an etch mask. At this time, the n+ InGaAs emitter cap layer 116 is wet etched using a phosphoric acid solution, and the n+ InP emitter grade layer 114 and the n InP emitter layer 112 are wet etched using an etching solution made by mixing phosphoric acid and hydrochloric acid. The n+ InGaAs emitter cap layer 116 has an etch selectivity derived from material property differences with respect to the n+ InP emitter grade layer 114 disposed therebelow. Therefore, even though the n+ InGaAs emitter cap layer 116 is wet etched sufficiently to form an under-cut between the emitter electrode 125a and the n+ InGaAs emitter cap layer 116, the damage or etching of the p+ InGaAs base layer 108 can be prevented. Also, since the second etch stopper layer 110 formed of an n+ InGaAs layer, which has different material properties from the n InP emitter layer 112, is formed under the n InP emitter layer 112, an etch selectivity is ensured between the n InP emitter layer 112 and the second etch stopper layer 110. Therefore, the n+ InP emitter grade layer 114 and the n InP emitter layer 112 can be formed in an under-cut shape with respect to the emitter electrode 125a by sufficiently etching the n+ InP emitter grade layer 114 and the n InP emitter layer 112 like the n+ InGaAs emitter cap layer 116. Accordingly, the n+ InGaAs emitter cap layer 116, the n+ InP emitter grade layer 114, and then InP emitter layer 112, which have been etched, have a line width smaller than a lower portion of the emitter electrode 125a.

Next, a second silicon nitride film (not shown) is deposited on the resultant product to a thickness of 50 to 100 to maintain a gap, that is, to insulate, between sidewalls of the emitter layers 112, 114, and 116 and the p+ InGaAs base layer 108. Next, the second silicon nitride film is anisotropically etched using the emitter electrode 125a as a mask. As a result, the second etch stopper layer 110 on both sides of the emitter electrode 125a is exposed. Then, a photoresist pattern (not shown) is formed on the resultant product so that a region for forming a base electrode can be exposed. Next, a predetermined portion of the exposed second etch stopper layer 110 is etched using the photoresist pattern as a mask. Afterward, the photoresist pattern is removed. Here, reference numeral 128 denotes a portion where an under-cut is formed.

Figure 9:
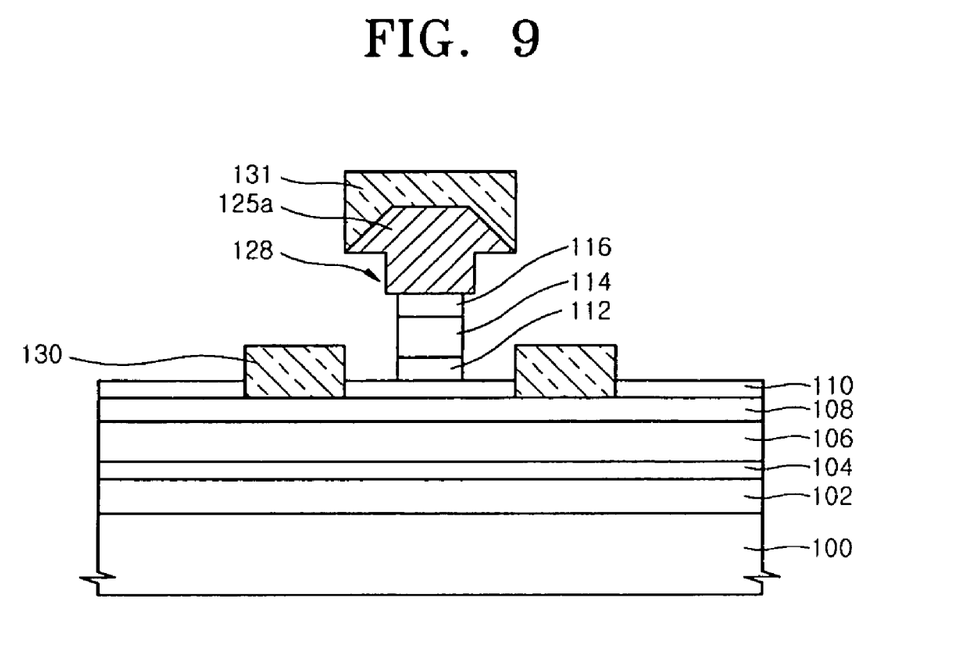

Referring to FIG. 9, base electrodes 130 that contact the exposed p+ InGaAs base layer 108 are formed. The base electrodes 130 can be formed using selective evaporation or sputtering like the emitter electrode 125*a*. At this time, when the base electrodes 130 are formed using the above methods, the base electrodes 130 are also formed on the emitter electrode 125*a* as a dummy electrode 131. Although the dummy electrode 131 is formed simultaneously and of the same material as the base electrodes 130, the dummy electrode 131 mostly serves as the emitter electrode since the dummy electrode 131 is separated from the base electrodes 130 and contacts the emitter electrode 125*a*. The base electrodes 130 may have a thickness smaller than the sum of the thicknesses of the n InP emitter layer 112, the n+ InP emitter grade layer 114, and the n+ InGaAs emitter cap layer 116 to prevent electrical shortage between the base electrode 130 and the emitter electrode 125*a*.

Figure 10:
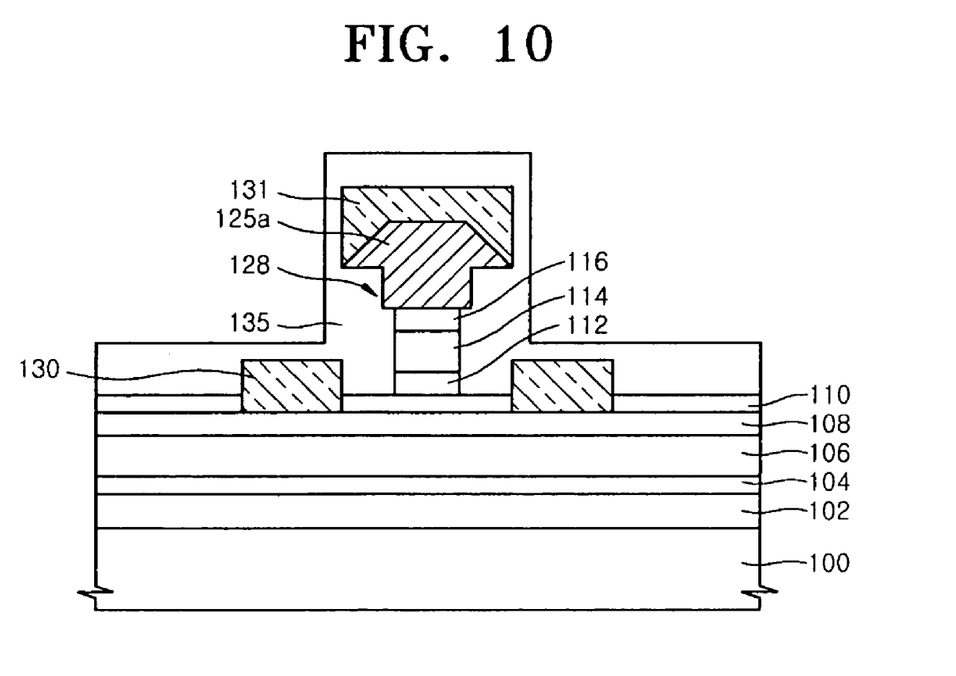

Referring to FIG. 10, a third silicon nitride film 135 is formed on the resultant product of the semi-insulating InP substrate 100. The third silicon nitride film 135 is deposited to a thickness sufficient to fill the under-cut portion 132.

Figure 11:
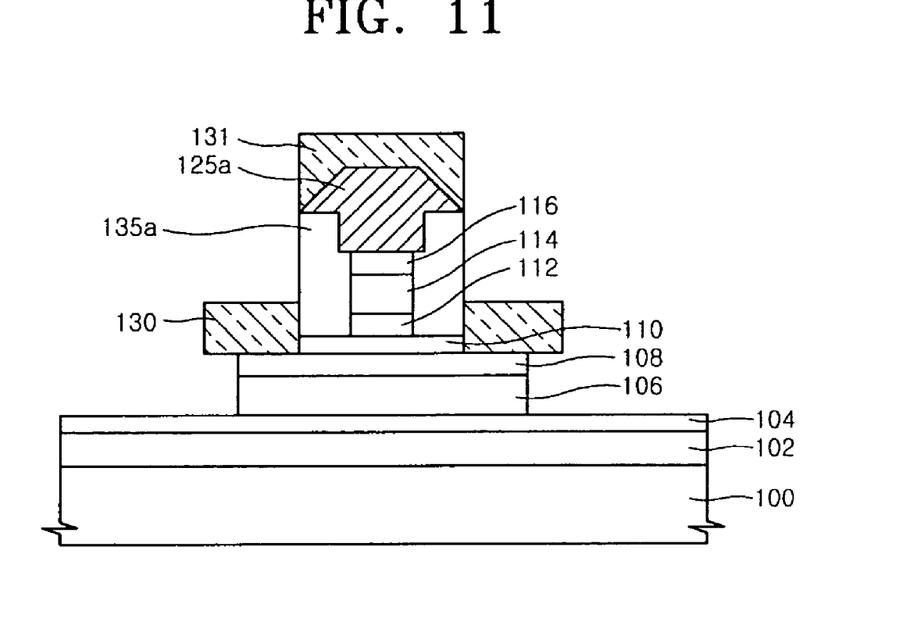

Next, referring to FIG. 11, a nitride film spacer 135*a* is formed in the under-cut portion 132 by anisotropically etching the third silicon nitride film 135 until surfaces of the base electrode 130 and the second etch stopper layer 110 are exposed. The emitter layers 116, 114, and 112 are covered and the emitter electrode 125*a* is completely insulated from the base electrode 130 by the nitride film spacer 135*a*, thereby reducing external parasitic capacitance. Furthermore, since the nitride film spacer 135*a* has a relatively high dielectric constant, the parasitic capacitance of the emitter layers 116, 114, and 112 can be further reduced.

Next, the p+ InGaAs base layer 108 and the n− InGaAs collector layer 106 are etched using the base electrode 130 and the dummy base electrode 131 as masks. At this time, the p+ InGaAs base layer 108 and the n− InGaAs collector layer 106 may be over-etched using a phosphoric acid etching solution. The p+ InGaAs base layer 108 and the n− InGaAs collector layer 106 can be over-etched without loss of lower layers since the first etch stopper layer 104 formed of InP is located below the n− InGaAs collector layer 106. As a result, both sidewalls of the p+ InGaAs base layer 108 and the n− InGaAs collector layer 106 are located between outer side walls of the pair of base electrodes. Therefore, a bonding area between the p+ InGaAs base layer 108 and the n− InGaAs collector layer 106 is reduced compared to the conventional art, thereby reducing parasitic capacitance.

Figure 12:
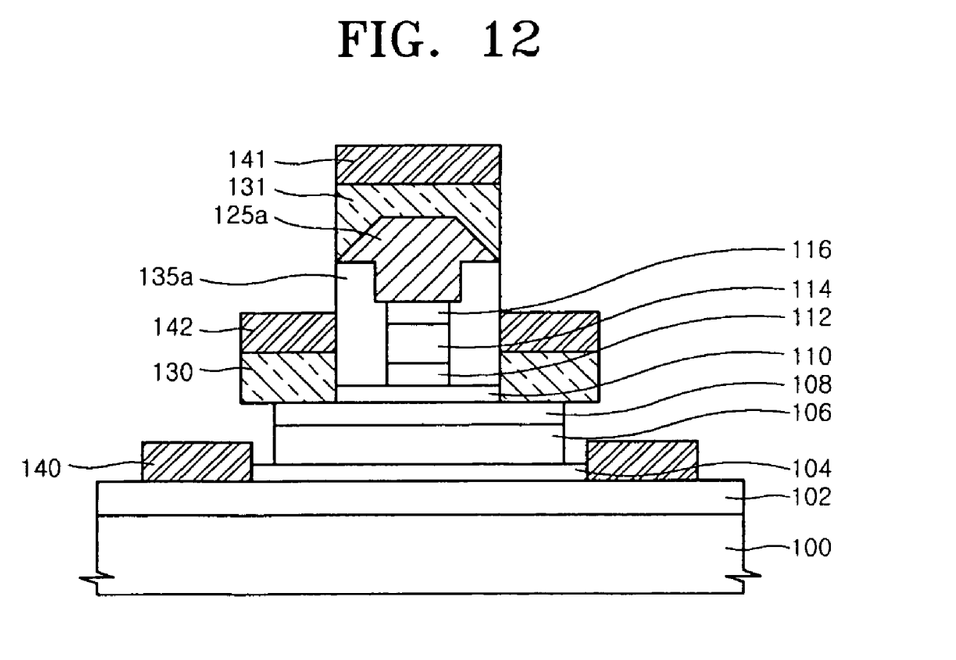

Referring to FIG. 12, a photoresist pattern (not shown) is formed on an upper surface of the resultant product on the compound semiconductor substrate 100 to expose a predetermined portion of the n+ InGaAs sub-collector layer 102. Next, the n+ InGaAs sub-collector layer 102 is exposed by etching the exposed first etch stopper layer 104 using the photoresist pattern as a mask. Since the first etch stopper layer 104 is an InP layer, the first etch stopper layer 104 may be etched using an etch solution made by mixing phosphoric acid and hydrochloric acid.

Next, a collector electrode 140 is formed on the exposed n+ InGaAs sub-collector layer 102 using a metal deposition method, for example, an evaporation method, a sputtering method, or a lift-off method. In the lift-off method, the collector electrode 140 is formed in a self-aligning manner with respect to the base electrode 130. That is, a sidewall of the collector electrode 140 and a sidewall of the base electrode 130 are parallel to each other. When the collector electrode 140 is formed using a deposition method, dummy collector electrodes 141 and 142 are formed on the emitter electrode 125*a* and the base electrode 130. As described above, the dummy collector electrode 141 on the emitter electrode 125*a* acts as an emitter electrode, and the dummy collector electrode 142 on the base electrode 130 acts as a base electrode. The formation of the dummy collector electrodes 131, 141, and 142 substantially increases the thickness of the base electrode 130, thereby reducing base resistance of the HBT device.

To improve the contact resistance, a portion of an exposed surface of the n+ InGaAs sub-collector layer 102 can be etched before forming the collector electrode 140.

Figure 13:
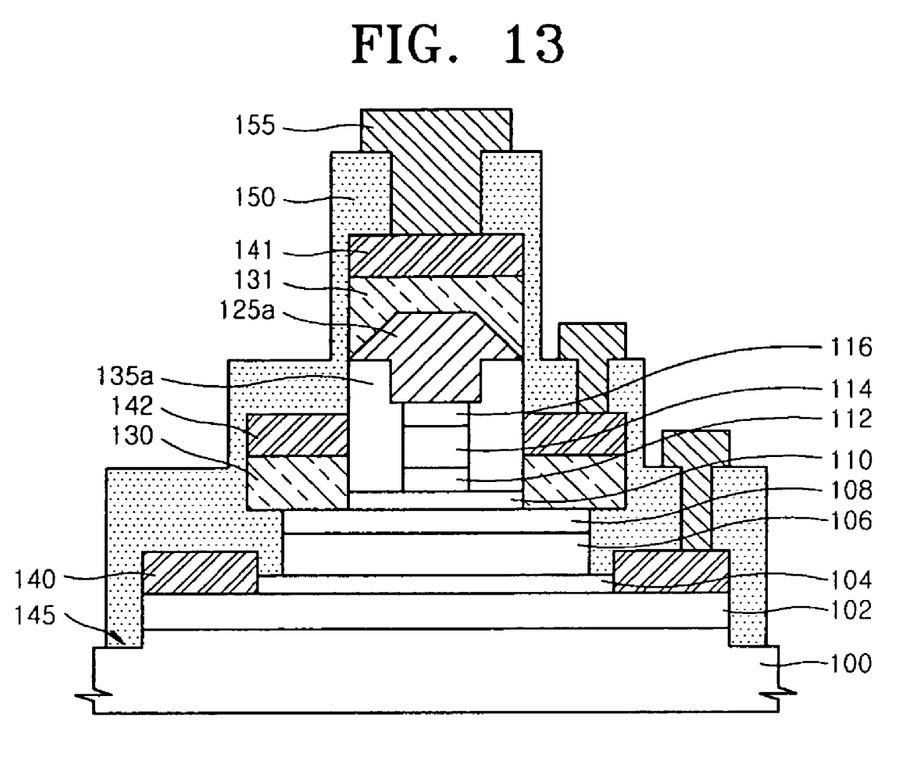

Referring to FIG. 13, device isolation is realized by etching a predetermined thickness of the n+ InGaAs sub-collector layer 102 and the semi-insulating InP substrate 100 using the collector electrode 140 as a mask. The emitter electrode 125*a* and the base electrode 130 are formed in a self-aligning manner, and the base electrode 130 and the collector electrode 140 are also formed in a self-aligning manner. Therefore, the device isolation can be achieved without using an additional mask. The etching of the n+ InGaAs sub-collector layer 102 and the semi-insulating InP substrate 100 can be performed by both dry etching using a $BCl_3$ gas and wet etching using a phosphoric acid solution. Reference numeral 145 denotes a device isolation region.

Then, an inter-insulating layer 150, for example, a silicon nitride film is deposited on the resultant product. The inter-insulating layer 150 can be deposited to a thickness of, for example, 4000 to 6000 Å. Next, a predetermined portion of the inter-insulating layer 150 is etched to expose a surface 141 of the emitter electrode 125*a*, a surface 142 of the base electrode 130, and the collector electrode 140. Then, a metal wire 155 is formed to respectively contact the surface of the exposed emitter electrode 125*a*, the surface of the base electrode 130, and a portion of the collector electrode 140 using a metal deposition method or a lift-off method.

As described above, according to the present invention, layers that constitute an emitter electrode and an emitter region are formed in a "T" shape using an under-cut method. Also, a nitride film spacer is formed in the under-cut portion of the "T" shaped emitter electrode. As a result, insulation between the emitter layers and the base electrode can be obtained, and also, parasitic capacitance between the emitters and the base can be reduced.

Also, in the present invention, etch stopper layers are respectively interposed between an InP layer and an InGaAs layer, that is, a sub-collector layer and a collector layer, and between a base layer and an emitter layer. Accordingly, when under-cut etching (over-etching) for forming an electrode in a self-aligning manner is performed, the loss of layers under the electrode can be prevented, thereby preventing the electrode from experiencing a lifting-off phenomenon.

Also, in the present invention, since an emitter electrode, a base electrode, and a collector electrode are formed by a selective adsorption method according to a self-aligning manner, a dummy base electrode and a collector electrode are formed on the emitter electrode, and a dummy collector electrode is formed on the base electrode. Therefore, there is an advantage of increasing the thickness of the base electrode, as the resistance of the base electrode is reduced.

Also, in the present invention, since the emitter electrode and the base electrode are formed in a self-aligning manner and the base electrode and the collector electrode are also formed in a self-aligning manner, a bonding area between the base and collector is reduced resulting in the reduction of parasitic capacitance, thereby eventually increasing operating speed of the HBT device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A hetero-junction bipolar transistor comprising:
    a semi-insulating compound substrate;
    a sub-collector layer formed on the semi-insulating compound substrate;
    a pair of collector electrodes disposed at a predetermined distance apart from each other on a predetermined portion of the sub-collector layer;
    a collector layer and a base layer disposed between the collector electrodes;
    a pair of base electrodes disposed at a predetermined distance apart from each other on a predetermined portion of the base layer;
    an emitter layer stack disposed between the base electrodes; and
    an emitter electrode that is formed on the emitter layer stack, wherein the emitter electrode comprises a lower portion and an upper portion which is disposed on the lower portion and the width of the upper portion is wider than the width of the lower portion and the width of the lower portion of the line width of the emitter electrode is wider than the width of the emitter layer stack, and
    wherein both sidewalls of the emitter electrode are respectively aligned with inner walls of the pair of base electrodes, and sidewalls of the collector layer and the base layer are located between outer sidewalls of the pair of base electrodes.

2. The hetero-junction bipolar transistor of claim 1, further comprising an insulating spacer between the emitter layer and the base electrode.

3. The hetero-junction bipolar transistor of claim 2, wherein the insulating spacer is formed of silicon nitride.

4. The hetero-junction bipolar transistor of claim 1, wherein the emitter electrode comprises an emitter metal layer, a base metal layer, and a collector metal layer, and the base electrode comprises a base metal layer and a collector metal layer.

5. The hetero-junction bipolar transistor of claim 1, wherein the substrate is a semi-insulating InP substrate.

6. The hetero-junction bipolar transistor of claim 1, wherein the emitter layer stack comprises:
    an emitter layer,
    an emitter grade layer formed on the emitter layer; and
    an emitter cap layer formed on the emitter grade layer.

7. The hetero-junction bipolar transistor of claim 6, wherein the sub-collector layer, the collector layer, the base layer, and the emitter cap layer are formed of InGaAs, and the emitter layer and the emitter grade layer are formed of InP.

8. The hetero-junction bipolar transistor of claim 7, further comprising a first etch stopper layer interposed between the sub-collector layer and the collector layer, and a second etch stopper layer interposed between the base layer and the emitter layer.

9. The hetero-junction bipolar transistor of claim 8, wherein the first etch stopper layer is an InP layer, and the second etch stopper layer is an InGaAs layer.

* * * * *